United States Patent [19]

Miller et al.

[11] Patent Number: 5,126,674
[45] Date of Patent: Jun. 30, 1992

[54] PLANAR IMAGING BY NUCLEAR MAGNETIC RESONANCE

[75] Inventors: Joel B. Miller, Cheverly; Allen N. Garraway, Fort Washington, both of Md.

[73] Assignee: The United States of America as represented by the Secretary of the Navy, Washington, D.C.

[21] Appl. No.: 574,182

[22] Filed: Aug. 29, 1990

[51] Int. Cl.$^5$ ............................................. G01R 33/20
[52] U.S. Cl. ...................................... 324/309; 324/307
[58] Field of Search ............... 324/300, 307, 309, 310, 324/311, 312, 313, 314; 128/653.4, 653.5 C

[56] References Cited

U.S. PATENT DOCUMENTS

| | | | |
|---|---|---|---|
| 4,374,360 | 2/1983 | Sepponen | 324/309 |
| 4,528,509 | 7/1985 | Radda et al. | 324/309 |
| 4,684,890 | 8/1987 | Briquet et al. | 324/309 |

*Primary Examiner*—Michael J. Tokar
*Attorney, Agent, or Firm*—Thomas E. McDonnell; Barry A. Edelberg

[57] ABSTRACT

Materials are imaged by exciting only one volume of interest (VOI) at a time while leaving the other undisturbed. By switching the irradiation frequency and probe tuning to the next VOI, the time delay between acquisitions of different VOI's may be essentially eliminated. The present invention may be implemented using a new coil design which is also useful for microscale planar imaging.

13 Claims, 2 Drawing Sheets

PLANAR IMAGING BY NUCLEAR MAGNETIC RESONANCE

BACKGROUND OF THE INVENTION

1. Field of the Invention

The present invention relates generally to the imaging of materials, and more specifically to the imaging of materials by nuclear magnetic resonance.

2. Description of the Prior Art

NMR imaging is used primarily for medical applications and is known in that context as Magnetic Resonance Imaging (MRI). In most MRI applications, (i) the NMR image is from the hydrogen nuclei from rather mobile water species in the body; (ii) the body is placed within a large, homogeneous magnet and within a set of switchable, or time-varying, magnetic field gradient coils and; (iii) the signal is excited (and sometimes detected) by rf coils which surround the body. There have already been some approaches to the general problem of imaging materials and to the more specific problems of "one-sided" imaging (in which the sample is outside both the magnet and rf coil).

NMR imaging of large planar structures requires that the material be accessed from one side. To date no one-sided (planar) NMR imaging schemes have been demonstrated, although one-sided NMR spectroscopy (in which the entire signal from a remote region is examined, but without any spatial discrimination) has been used for several applications. There are a number of possible modes for planar NMR imaging of materials. These may be roughly broken down into two categories: one requires a homogeneous magnetic field and the other requires an inhomogeneous magnetic field. The present inventors have already published a method for imaging materials with NMR which is amenable to planar imaging within a homogeneous magnetic field. This mode of imaging is referred to as rf selected planar imaging.

That earlier method for imaging materials in a homogeneous magnetic field employs one-sided rf excitation and detection, in which the sample is within a homogeneous magnet but outside only the rf coil. The method relies on inhomogeneous rf excitation for spatial localization of the signal. All spins within the coil volume are excited but only spins from a small region are left observable after excitation. Thus spins in a volume which is of roughly planar cross-section and parallel to the plane of the rf surface coil are observed. This region is called the volume of interest (VOI). The dimensions of the VOI are determined by the rf excitation scheme and by the coil geometry. If the VOI has a sufficiently small depth, it may be viewed as essentially planar. Likewise, if the VOI also has a sufficiently small diameter, the VOI is essentially one-dimensional. Nevertheless, because even that essentially one-dimensional region maintains a measurable depth and diameter, and because the dimensions of the region of interest can be varied depending upon the requirements for precision, even an essentially one-dimensional region of interest is called a VOI.

The drawback to the rf selected technique is that all planes parallel to the rf surface coil are excited simultaneously while only one is detected: the signal from regions outside the VOI is lost and the spin system must return to equilibrium before the next plane can be detected. This return to equilibrium is determined by the spin-lattice relaxation time $T_1$ and for materials can take on the order of several seconds to minutes.

NMR imaging in large static magnetic field gradients has also been reported. In the experiments reported to date the imaging has been accomplished inside a homogeneous magnet but at the edge of the magnet coil such that the magnitude of the field is dropping rapidly. The sample was also contained inside a solenoidal rf coil. Detection was accomplished by keeping the NMR probe tuned to a single frequency and moving the sample through the magnetic field gradient.

SUMMARY OF THE INVENTION

It is an object of the present invention to overcome the above-mentioned deficiencies of the prior art.

It is an another object of the present invention to non-destructively evaluate materials by NMR.

It is a further object of the present invention to non-destructively evaluate materials by NMR with good resolution and at a good speed.

It is yet another object of the present invention to image thin coatings as well as full three-dimensional objects, by NMR.

These and other objects are achieved by using an inhomogeneous magnetic field created by a one-sided magnet and rf frequency selection with a surface coil to excite only one VOI at a time, while leaving the others unperturbed. The use of one-sided magnets and surface coils allows objects too large to fit inside a conventional magnet to be imaged. The necessary rf field strengths can be obtained with reasonable power since only a small portion of the sample is exposed to the rf field of the surface coil at any given time. By switching the irradiation frequency and probe tuning (or, equivalently, moving the sample) to the next VOI, the time delay between acquisitions of different VOI's is essentially eliminated, thus saving a significant amount of time when imaging a three-dimensional sample. The induced change in nuclear spin is of course detected by conventional means. Since spins in neighboring VOI's have not been excited, it is unnecessary to wait for them to come to equilibrium before observing the next VOI. In principle all VOI's may be observed consecutively without any relaxation delays. This method can lead to a substantial savings in time under favorable conditions, as realized in the previous art. The present invention may be implemented using a novel coil design which is also useful for microscale planar imaging.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

The method according to the present invention is particularly useful for imaging objects to about 0.001 to 0.01 cm resolution in one dimension. It is well-known that the circuits used for rf excitation and detection in NMR have a limited bandwidth. In conventional MRI, whenever pulsed or time-dependent magnetic field gradients are applied, the distribution of fields is chosen so that the corresponding distribution in nuclear Larmor frequencies is still within the NMR probe bandwidth. In contrast, a preferred embodiment of the present invention utilizes a sufficiently inhomogeneous static (i.e., constant with respect to time) magnetic field so that the range of Larmor frequencies of the sample nuclei within the region of the magnetic field is actually broader than the bandwidth of the magnetic NMR probe: hence the nuclei exposed to the static magnetic field and having Larmor frequencies outside the probe bandwidth can be neither excited nor detected since they are not exposed to resonant rf energy from the NMR probe. The selection of a volume of interest by the combination of static field inhomogeneity and probe bandwidth is the basis of the frequency selected planar NMR imaging technique.

Figure 1:
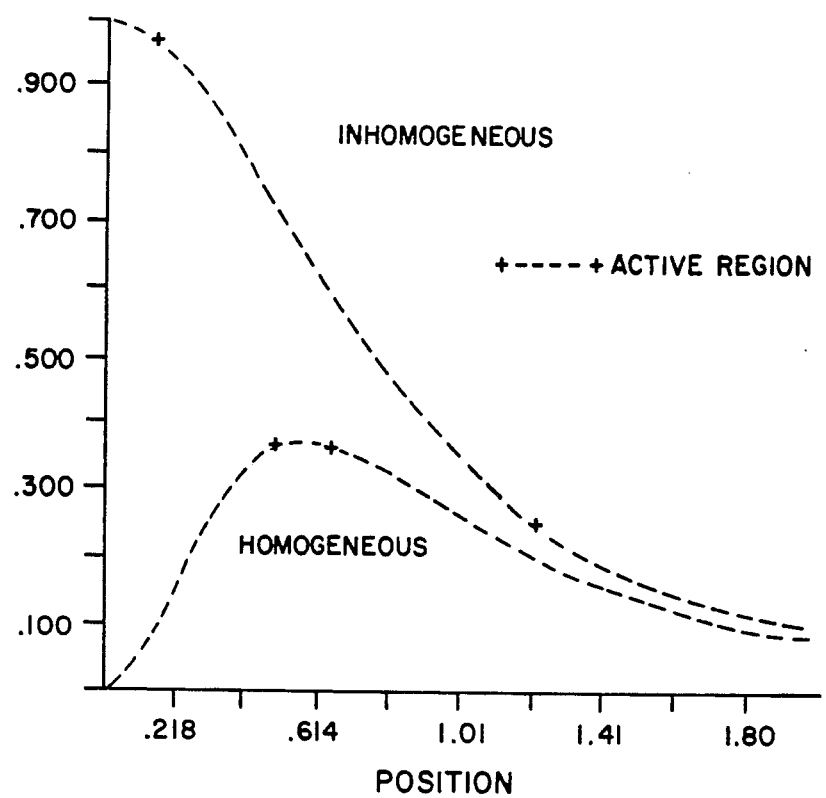
FIG. 1 is a plot of magnetic field strength versus position for one-sided magnets creating either a homogeneous or inhomogeneous magnetic field. The position axis is normalized to the outer radius of the magnets. The regions of the plots between the crosses indicate representative usable regions of the fields.

FIG. 1 contrasts an inhomogeneous magnetic field having such a field gradient with an homogeneous magnetic field. Note that within much of the active region, the magnitude of the inhomogeneous field is far greater than is the magnitude of the homogeneous field, leading to better sensitivity. The degree of inhomogeneity required to practice the present invention depends upon the resolution desired. In general, the greater the inhomogeneity of the applied field, the finer the potential resolution. Within the scope of this specification and the appended claims, a magnetic field is deeemed inhomogenous if the desired degree of spatial resolution is acheived by altering the frequency range of the NMR probe irradiating the sample within that magnetic field.

Figure 2:
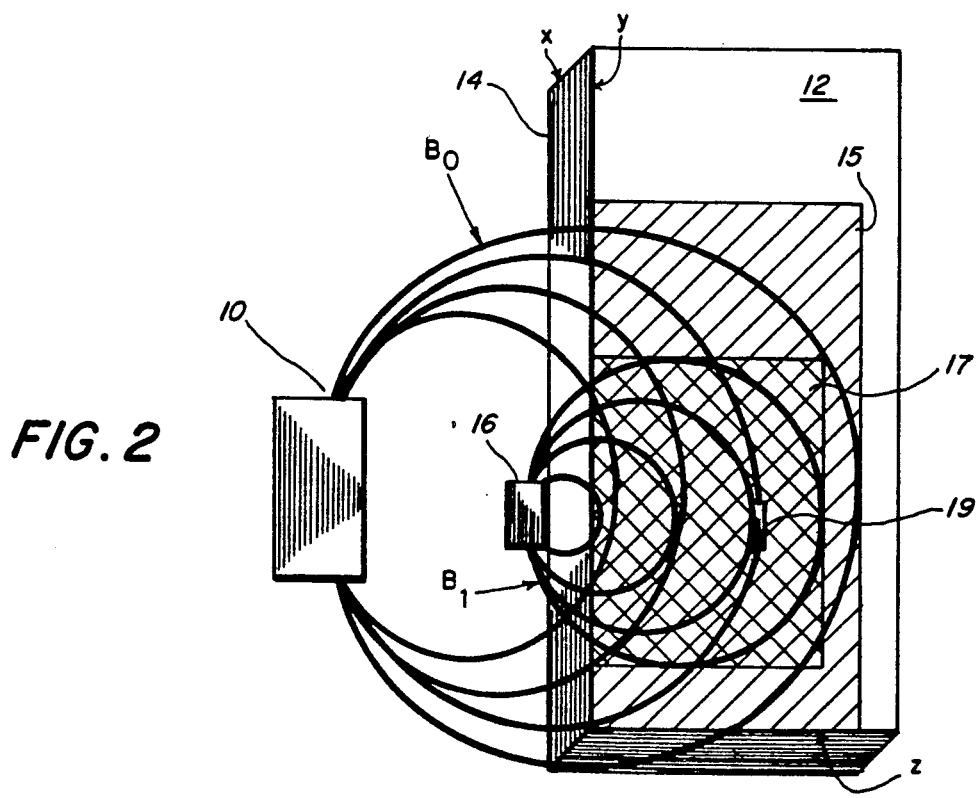
FIG. 2 is a schematic diagram showing the proposed placement of the magnet and NMR probe for frequency selected planar imaging. The lines of static and rf magnetic field strength within the object being imaged are indicated. These lines delineate the volume of the sample exposed to the static magnetic field and the region irradiated by the rf field. The portion of the sample where the rf frequency equals the Larmor frequency is indicated. (The portion is also referred to as the volume of interest (VOI), which is a subset of the overall volume).

The practice of the present invention can be understood with reference to FIG. 2. As shown in FIG. 2, a magnet 10 creates a magnetic field $B_0$ which is inhomogeneous along the depth (z-axis) of a sample 12. The magnet 10 lies near (outside) the surface (xy plane) 14 of sample 12 and typically comprises coils (not shown) arranged essentially perpendicular to the z-axis of sample 12. The curves schematically illustrate the distribution of magnetic field strength along the z-axis of the exposed volume 15 of sample 12, with contours close to the magnet representing greater magnetic field strength. An NMR probe 16 is positioned between magnet 10 and surface 14. NMR probe 16 produces within irradiated region 17 a rf-modulated magnetic field $B_1$ having a bandwidth narrower than the range of Larmor frequencies of nuclei within magnetic field $B_0$. Accordingly, the probe can excite only those nucleus having a Larmor frequency within the probe bandwidth. Because the Larmor frequency of a nucleus within sample 12 depends upon the strength of the ambient magnetic field, and because the field strength within sample 12 is depth-dependent, the Larmor frequency of a nuclei within sample 12 also depends on depth. Thus, the probe only excites and images sample 12 at a depth where the Larmor frequencies of the nuclei rest within the bandwidth of the NMR probe 16. The shape of the field emitted by probe 16 is determined by the geometry of its rf coils. By selecting an appropriate combination of $B_0$ strength and inhomogeneity and $B_1$ strength, frequency, bandwidth, and coil geometry, a desired VOI 19 (the detected portion) may be selected and a desired degree of resolution obtained. The narrower the $B_1$ bandwidth, the higher will be the spatial resolution. The coil geometry will determine the $B_1$ field strength at points radially spaced from the central axis of the rf coil probe 16 and thus determine the radius of VOI 19 in the dimension perpendicular to the $B_1$ magnetic field vector.

Since spins in neighboring VOI's have not been excited, it is unnecessary to wait for them to relax back to thermal equilibrium before observing the next VOI. In principle all VOI's may be observed consecutively without any relaxation delays. This method can lead to a substantial savings in time under favorable conditions.

An image can be constructed as follows. The magnet and NMR probe are positioned over a small region, having a linear dimension of about 2 to 10 cm (preferably about 5 cm) of the sample. Sample nuclei having Larmor frequencies within the bandwidth of the rf-energy emitted by the NMR probe absorb and are excited by that energy. Nominally planar slices of this region are excited. After the slices are excited, the NMR probe is, as done conventionally, switched from its excitation mode to its detection mode. The excited nuclei emit rf energy at nearly the same frequencies as the frequency of the excitation energy. This emitted rf energy is detected to give a measure of the amount of material in each slice: the probe is retuned and the excitation frequency range stepped in order to excite another slice and eventually to generate an essentially one-dimensional profile of this small region. A separation between planes as small 0.001 cm is feasible with proper magnet design. The full 3-dimensional image is built up by repositioning the magnet and NMR probe (or, equivalently, moving the sample) to an adjacent region of the sample and repeating the process described above. Repositioning can be done mechanically or, somewhat more elegantly, by activating another rf coil in a matrix or mesh of noninteracting surface coils. In the above case, each pixel could correspond to about $5 \times 5 \times 0.01$ cm.

For each region, all measured VOI can be sampled during one relaxation period $T_1$ (spin-lattice relaxation time); though if the signal is weak, each VOI must be sampled more than once. Before a VOI can be resampled, spin-lattice relaxation must occur. In cases where $T_1$ is long, adjacent regions can be measured before returning to the original region for resampling.

The above-described method obtains spin-density images with the frequency selected planar imaging technique. It is also possible to weight the images based on several NMR parameters. Weighting images in medical MRI is an important technique for discriminating between different types of tissue. Likewise, weighting can be used with planar imaging to discriminate between different materials or materials in different states. $T_2$ (spin-spin relaxation time) weighting can be accomplished simply by allowing a delay between the rf excitation and the beginning of detection. Saturation-recovery techniques can be used for $T_1$ weighting.

All or part of the sample can be exposed to the magnetic field from the inhomogeneous magnet. The NMR probe may irradiate all or part of the exposed volume of the sample. The frequency range of the rf energy from the NMR probe may correspond to the range of Larmor frequencies of sample nuclei in all or part of the irradiated region.

There are advantages to the use of an inhomogeneous magnetic field other than the time savings associated with the relaxation delay. Current designs for one-sided magnets produce a homogeneous magnetic field by using two opposing magnets to partially cancel out each other's field. This cancellation substantially reduces the overall magnitude of the magnetic field. Since NMR signal-to-noise diminishes at lower magnetic field, this field cancellation lowers the sensitivity of the technique. Furthermore, with such an opposing geometry, only a small region of the field is actually homogeneous and hence the useful volume for imaging is reduced. Finally, it should be easier to construct a magnet with a large static inhomogeneity than a magnet with a high static homogeneity.

Representative magnet requirements for large scale frequency selected planar imaging in an inhomogeneous magnetic field are listed below:

$B_0$: >2 T $dB_0/dz$: >10 T/m

Region of uniform $dB_0/dz$: >5 cm dia. by 15 cm on axis

Resolution: 0.01 cm (100 $\mu$m) in 15 cm on axis by 20 cm$^2$ $dB_0/dV$: <5000 T/m$^3$ (0.005 T/cm$^3$) or 0.001 T/voxel In general, an NMR probe consists of a rf coil 18 to produce the rf $B_1$ field and detect the nuclear signal, and appropriate components (capacitors, resistors, etc.) to tune the coil to the desired frequency and match it to the impedance of the transmitter. These tuning and matching components must be rapidly changed to implement the imaging scheme of the present invention, which requires not only the conventional rapid switching between excitation and detection modes, but also rapid stepping of excitation and detection frequencies. A number of possibilities exist to change these components, including the use of switches to rapidly insert and remove discrete components from the circuit. Such a switchable probe can be advantageously used in imaging techniques other than that of the present invention. Thus, the present invention includes probe design which can be used for both the above method and a technique referred to herein as Rf selected (microscale) planar imaging.

It is helpful to consider some background information before turning to the specialized probe design. Rf selected (microscale) planar imaging is similar, but not identical to frequency selected planar imaging. Two illustrative examples which may be particularly suited to rf selected (microscale) planar imaging involve chemically-modified surfaces and film-like coatings. In these cases the planar structures are large in two dimensions but very small in the third dimension, for example only 100 $\mu$m (0.01 cm). The spatial resolution into the surface required is on the order of 1 $\mu$m. It is presumed here that variations in the direction of the small dimension are of primary importance and that there is no need to look for small variations in the other two dimensions. Conventional NMR imaging approaches avoid imaging very small features because the small number of nuclei involved produce too small a signal. This constraint can be lifted however if the other two dimensions are allowed to be large so that the integrated signal in the VOI is adequate, even though one dimension is perhaps 100 times smaller than has been previously explored by NMR.

In practice for microscale planar imaging, the VOI should approximate a short cylindrical disk with a diameter of several cm and a height on the order of 1 $\mu$m. To image such a structure with the identical approach of large scale planar imaging technique of the present invention would require an extremely large gradient ($10^4$–$10^5$ T/m) in one dimension and high homogeneity in the other two. This approach is impractical. A more practical alternative is to use a "homogeneous" magnetic field and obtain spatial resolution through an inhomogeneous rf field. This approach of course requires an NMR probe circuit which generates a large rf gradient in one dimension and a homogeneous rf field in the other two dimensions, i.e., along an equipotential surface over the area of the probe. An NMR probe which can provide such a gradient is described below.

A new probe, which can switch between two inhomogeneous rf profiles, is part of this disclosure and is useful for use both microscale planar imaging and frequency-selected planar imaging according to the technique of the present invention. It is shown below that, as the thickness anticipated for the microscale planar imaging is so small, the inhomogeneous magnet proposed for the large scale imaging is sufficiently "homogeneous" to be used for microscale planar imaging.

The basic design of the new probe will be discussed before explaining the specific probe circuitry. It is well-known that a flat circular loop of wire such as those used as surface coils for NMR imaging produce an inhomogeneous $B_1$ field which varies by about a factor of 10 over a distance of one coil radius perpendicular to the plane of the coil. One may then obtain a gradient for use with 1 $\mu$m resolution by employing a coil with a radius of the order of 10 $\mu$m. Such a coil can be made by micro-lithography techniques. The volume encompassed by this coil is too small to produce a usable NMR signal. The present invention uses a planar array of these coils to provide an adequate volume. The coils are spaced so as to not couple magnetically. By connecting the coils in series one can use the same components to tune all coils and produce a sufficiently large inductance for easy tuning. To spatially resolve structures with a surface coil, the present invention relies on a series of rf pulses which produces observable nuclear magnetization in a region of constant $B_1$ field strength. Unfortunately the regions of constant $B_1$ field strength form curved surfaces which pass through the plane of the coil. It is therefore impossible to detect signal from only a single plane with a single surface coil.

Figure 3:
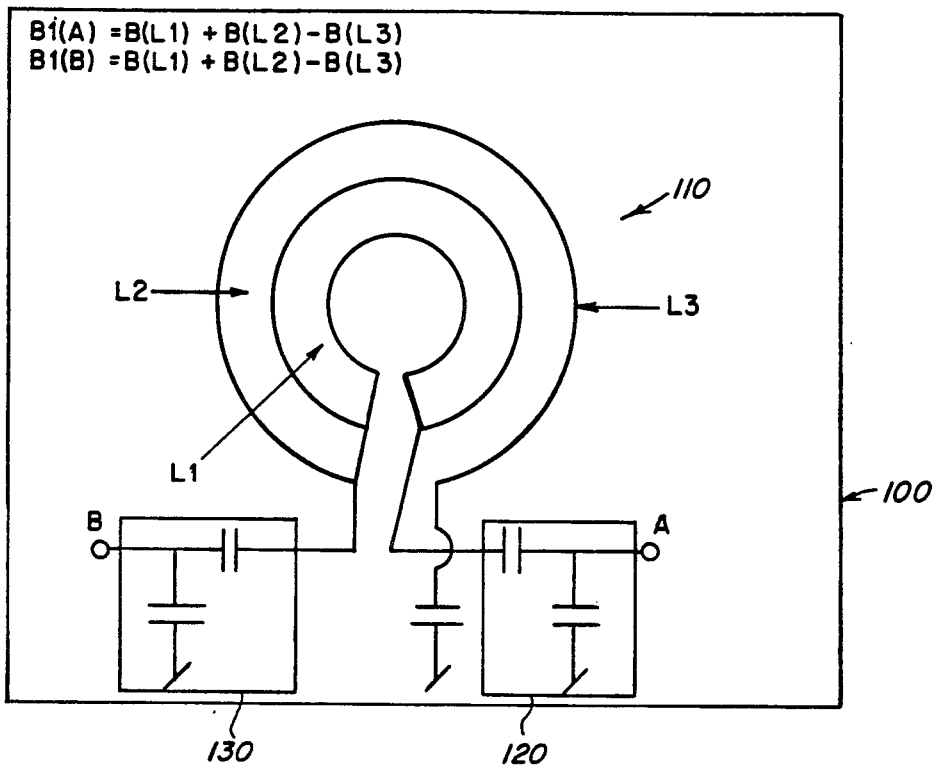
FIG. 3 is a schematic diagram of a switched coil probe and one possible circuit therefor. Excitation of the coils from port A produces a rf magnetic field which is the sum of the contributions from turns L1 and L2 minus L3. Port B produces a rf magnetic field which is the sum of the fields from turns L1, L2 and L3.
Figure 4:
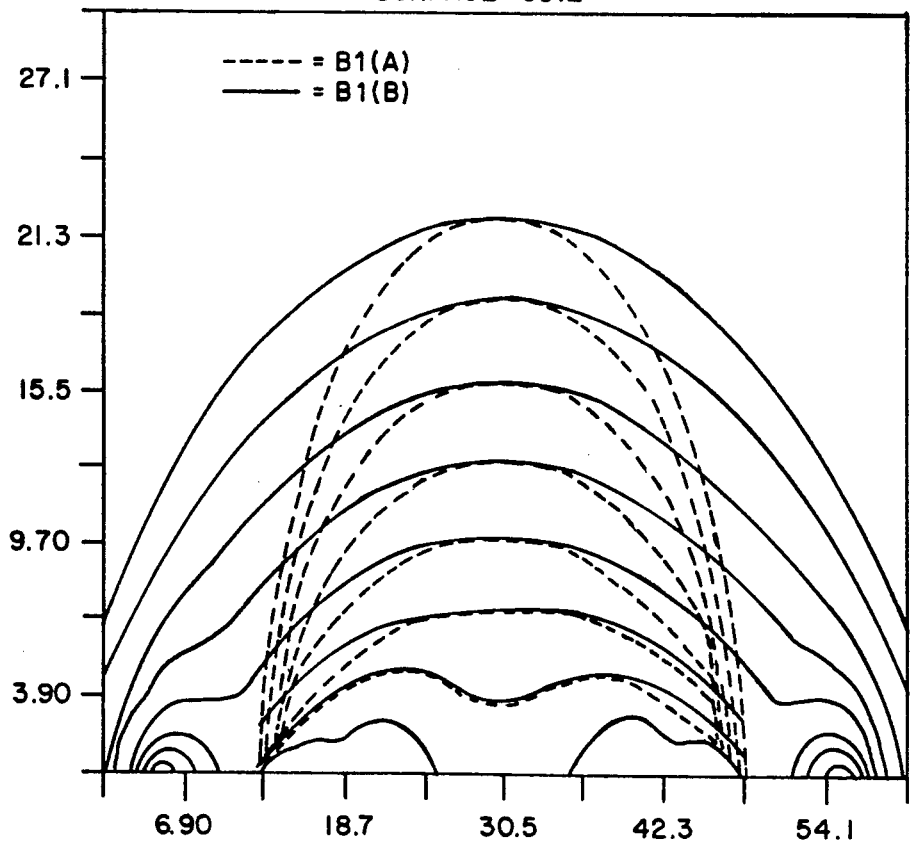
FIG. 4 is a plot of the calculated rf magnetic fields generated by the probe of FIG. 3 excited through ports A and B. The observed region is the intersection of A and B contours of equal field strength.

The present invention preferably uses a coil geometry and tuning circuit which allows changing of the $B_1$ field profile. This arrangement is referred to here as a switched coil probe. If the same series of pulses is applied consecutively on two different coil geometries, observable nuclear magnetization will be produced where the appropriate field contours of the two coil geometries intersect. Such an NMR probe is shown in FIG. 3, as probe 100. The basic idea is to have a multiple turn coil 110, having turns $L_1$, $L_2$, and $L_3$, which can be excited in two different ways. Under one excitation scheme (Path A) the coil is excited through the matching network 120 so that the current flows in the same direction in all turns. In this case the fields from the different turns add. In the second excitation scheme (Path B) the current in one or more turns is caused to flow the opposite direction to that of the remaining turns by excitation through matching network 130, causing the fields to subtract. By the proper choice of number of turns and the sign of the current in the turns, the field profile at the center of the coil is little changed while the profile at the edge of the coil changes drastically. Field calculations are shown in FIG. 4. As stated above, observable nuclear magnetization will be produced where the appropriate field contours of the two coil geometries intersect.

Representative magnet requirements for small scale rf selected planar imaging are listed below.

$B_0$: >2 T $dB_o/dz$: <<200 T/m

Region of uniform $dB_o/dz$: >10 cm dia. by 15 μm (0.0015 cm) on axis

Resolution: 0.5 μm in 15 μm on axis $dB_o/dV$: <30 000 T/m$^3$ (0.03 T/cm$^3$) or 0.0001 T/voxel Note that both sets of requirements for large scale and small scale planar imaging can be met by the same magnet.

Having described the invention, we present a qualitative treatment which indicates the regimes for which the present invention is advantageous over previous art. This specific treatment, including the best mode now known to perform the invention, is not intended to limit the scope of the invention described in this application.

There are a number of figure-of-merits that should be used to compare imaging techniques. A particularly important comparison is the time required to create the image. The frequency selected planar imaging method of the present invention may be compared with the prior art method using an inhomogeneous rf field to perform the selection in a homogeneous static magnetic field $B_o$. This comparison may be demonstrated theoretically using a mathematically modeled example.

Consider the time required to observe N voxels (the terms VOI and voxels will be used interchangeably here) in an sample using rf selection in a homogeneous magnetic field created by a one-sided magnet. If the same number of nuclei reside in each VOI and each is excited by a 90° pulse, then the signal emitted by one VOI is proportional to $B_{0rf}{}^n$, where $1<n<2$. Here the subscript "rf" denotes plane selection in the rotating frame ($B_1$ field selection). (The NMR signal is rigorously proportional to $B_0{}^2$, i.e. n=2. However, the forthcoming comparison of signal-to-noise ratios at different magnetic field strengths will necessitate different rf coils. Experience in NMR shows that for large changes in magnetic field strength and coil geometries, the proportionality is between linear and quadratic.) If the filter passband is matched to the width of the NMR resonance then the noise is proportional to $B_w{}^{\frac{1}{2}}$, where $B_w$ is the width of the NMR resonance. The signal-to-noise ratio for one VOI is proportional to $(B_{0rf}{}^n)(B_w{}^{-\frac{1}{2}})$. To obtain some minimum signal-to-noise, S, then $[S/(B_{0rf}{}^n)(B_w{}^{-\frac{1}{2}})]^2$ data sets must be averaged. As discussed earlier, the spin-lattice relaxation time $T_1$ determines the minimum time required for the NMR signal to recover after excitation. The total time required to observe N separate VOI with a signal-to-noise ratio S is therefore $N*T_1*[S/(B_{0rf}{}^n)(B_w{}^{-\frac{1}{2}})]^2$.

Now consider the time required to observe N voxels in a sample using frequency selected planar imaging in an inhomogeneous magnetic field according to the present invention. As before, the signal available from one VOI is proportional to $B_{0lf}{}^n(z)$. Here the z dependence is a reminder of the use of a strongly inhomogeneous magnetic field. The subscript 1f denotes laboratory frame selection ($B_0$ field selection). In such an inhomogeneous magnetic field the rf bandwidth will be determined by the characteristics of the NMR probe and rf power available. Earlier, the limiting of the excitation bandwidth by the bandwidth of the probe was discussed. Such a limitation will always be present There is however a second limit due to limited rf power available. Under this circumstance, irradiation over the VOI is not uniform. As a first approximation nuclear spins can only be observed within about $+/-B_1$ of resonance in their full intensity, where $B_1$ is the rf magnetic field strength. In this case, the receiver filter is matched to $2B_1$. If VOI is defined as the probe bandwidth only the fraction excited by the rf is observed, then the observed signal is proportional to $B_o{}^n(z)*[2QB_1/B_0(z)]^{\frac{1}{2}}$. Here Q is the probe quality factor. The total noise voltage admitted by the filter is proportional to $(2B_1)^{-\frac{1}{2}}$. The signal-to-noise ratio for one VOI is therefore proportional to $B_{0lf}{}^{n-1}(z)/2Q^{\frac{1}{2}}$. In analogy to arguments given above, the time required to observe N separate VOI with a signal-to-noise ratio of S is $T_1*[S/B_{0lf}{}^{n-\frac{1}{2}}(z)Q^{\frac{1}{2}}]^2$. Notice that since N voxels can be observed within one $T_1$, the imaging time is independent of N, the number of volumes of interest.

A figure of merit, F, can be derived for planar imaging in an inhomogeneous magnetic field by taking the ratio of the time required to observe N VOI with the inhomogeneous field method to that with the homogeneous field method:

$$F = T_{lf}/T_{rf} = N^{-1} B_{0rf}{}^{2n} B_{0lf}{}^{1-2n}(z) Q^{-1} B_w{}^{-1}.$$

Reasonable fields to expect from the two magnets are 0.7 T for the homogeneous field based on systems built to date and 0.67 T at a distance 10 cm from the inhomogeneous magnet (100 VOI each 0.01 cm thick). Typical values for Q will be around 100. Average resonance widths for heavily protonated organic materials are near 0.001 T. Based on these values and for n=1, the ratio $T_{lf}/T_{rf}$ is 0.07, so the proposed method employing inhomogeneous fields can be more than 10 times faster than the homogeneous field method.

The treatment of F presented above takes into account the fact that with a rf power limitation on planar imaging it will be necessary to sample each VOI several times at different frequencies in order to observe the entire VOI. Even with the extra signal averaging requirement, a large savings in time can be realized. This substantial time-saving is at the heart of this invention.

The new frequency selected planar imaging technique described above, and the novel NMR probe design which can implement that technique and others, are useful for, but not limited to, imaging samples which are very large in two dimensions and from less than 1 and up to 15 cm in the third dimension. Applications may include nondestructive testing of fiberglass ship hulls and airplane and rocket components made of organic composites. Liquids can also be analyzed by the frequency selected planar imaging technique.

Obviously, many modifications and variations of the present invention are possible in light of the above teachings. For example, although the specific example teaches sequential rf excitation of different portions of the sample within the field, i.e., one VOI at a time, two or more VOI's can be excited at once by simultaneously using two or more rf probes having distinct center frequencies and nonoverlapping bandwidths or a single coil emitting rf energy at two distinct center frequencies with nonoverlapping bandwidths. It is therefore to be understood that, within the scope of the appended claims, the invention may be practiced otherwise than as specifically described.

What is claimed is:

1. A method for the magnetic resonance analysis of a material, comprising the steps of:
   (a) causing a magnet to generate a magnetic field which is inhomogeneous along at least one axis;
   (b) applying said magnetic field to a volume of a sample of said material by orienting said sample with respect to said magnet so that said at least one axis along which said magnetic field is inhomogeneous extends within said volume and magnet does not physically confine said sample in any dimension, thus exposing said volume to said magnetic field;
   (c) orienting a nuclear magnetic resonance probe with respect to said sample so that said nuclear magnetic resonance probe does not physically confine said sample in any dimension;
   (d) irradiating a region of said exposed volume with rf energy from said nuclear magnetic resonance probe, said nuclear magnetic resonance probe having a first frequency range narrower than a range of nuclear Larmor frequencies of sample nuclei in said irradiated region and corresponding to a range of nuclear Larmor frequencies of sample nuclei in a portion of said irradiated region, whereby said sample nuclei in said portion are excited by said rf energy within said first frequency range;
   (e) stopping the irradiation of said region with said rf energy, whereby said excited sample nuclei within said portion emit rf energy;
   (f) detecting said rf energy emissions from said excited sample nuclei within said portion of said irradiated region;
   wherein said exposed volume is larger than said irradiated region.

2. The method of claim 1, wherein said exposed volume includes the entire sample.

3. The method of claim 1, wherein said detected portion includes the entire irradiated region.

4. The method of claim 1, wherein said sample is larger than said exposed volume.

5. The method of claim 1, further comprising:
   (i) irradiating said region of said exposed volume with rf energy from said nuclear magnetic resonance probe having a second frequency range narrower than the range of nuclear Larmor frequencies of sample nuclei in said irradiated region and corresponding to a range of nuclear Larmor frequencies of sample nuclei in an additional portion of said irradiated region, whereby said sample nuclei in said additional portion are selectively excited by said rf energy within said second frequency range;
   (ii) stopping the irradiation of said region with said rf energy, whereby said excited sample nuclei within said additional portion emit rf energy;
   (iii) detecting said rf energy emissions from said excited sample nuclei within said additional portion of said irradiated region.

6. The method of claim 5, wherein said sample nuclei within said different portions of said irradiated region are excited and detected sequentially.

7. The method of claim 5, wherein said sample nuclei within said different portions of said irradiated region are excited and detected simultaneously.

8. The method of claim 5, further comprising:
   (1) performing steps (c)-(e) and (i)-(iii) upon an additional region of said exposed volume.

9. The method of claim 8, comprising:
   (g) applying said magnetic field to an additional volume of said sample by orienting said sample and magnet with respect to each other so that said at least one axis along which said magnetic field is inhomogeneous extends within in said additional volume and said magnet does not physically confine said sample in any dimension, thus exposing said additional volume to said magnetic field;
   (h) performing steps (c)-(e), (i)-(iii) and (1) upon said additional exposed volume.

10. A nuclear magnetic resonance surface probe comprising a two-dimensional array of essentially geometrically parallel multiple-turn coils, electrically connected in series, said array providing an essentially homogeneous rf field along an equipotential surface over the area of the probe;
    first excitation means for exciting the coils to cause current to flow in the same direction in all turns of said coil; and
    second excitation means for exciting the coils to cause current to flow, in at least one turn, in a direction opposite the direction of current in another turn of said coils.

11. The probe of claim 10, wherein each of said coils comprises a flat circular loop of wire.

12. A nuclear magnetic resonance surface probe comprising a two-dimensional array of essentially geometrically parallel multiple-turn coils, electrically connected in parallel, said array providing an essentially homogeneous rf field along an equipotential surface over the area of the probe;
    first excitation means for exciting the coils to cause current to flow in the same direction in all turns of said coil; and
    second excitation means for exciting the coils to cause current to flow, in at least one turn, in a direction opposite the direction of current in another turn of said coils.

13. The probe of claim 12, wherein each of said coils comprises a flat circular loop of wire.

* * * * *